United States Patent
Mobbs

(10) Patent No.: US 9,490,512 B2
(45) Date of Patent: Nov. 8, 2016

(54) TUNEABLE FILTER

(71) Applicant: Filtronic Wireless Limited, Yeadon, West Yorkshire (GB)

(72) Inventor: Christopher Mobbs, Menston (GB)

(73) Assignee: FILTRONIC WIRELESS LIMITED, West Yorkshire (GB)

( * ) Notice: Subject to any disclaimer, the term of this patent is extended or adjusted under 35 U.S.C. 154(b) by 509 days.

(21) Appl. No.: 13/786,181

(22) Filed: Mar. 5, 2013

(65) Prior Publication Data

US 2013/0229243 A1    Sep. 5, 2013

(30) Foreign Application Priority Data

Mar. 5, 2012    (GB) .................................. 1203833.7

(51) Int. Cl.

| | |
|---|---|
| *H01P 1/205* | (2006.01) |
| *H03H 9/46* | (2006.01) |
| *H03J 1/00* | (2006.01) |
| *H01P 1/208* | (2006.01) |
| *H01P 7/06* | (2006.01) |
| *H03J 5/02* | (2006.01) |
| *H01P 7/04* | (2006.01) |

(52) U.S. Cl.
CPC ............ *H01P 1/2053* (2013.01); *H01P 1/2084* (2013.01); *H01P 7/04* (2013.01); *H01P 7/06* (2013.01); *H03H 9/46* (2013.01); *H03J 1/00* (2013.01); *H03J 5/02* (2013.01)

(58) Field of Classification Search
CPC ........ H01P 1/20; H01P 1/205; H01P 1/2053; H01P 1/208; H01P 1/2084; H01P 1/2136; H01P 7/04; H01P 7/06; H03H 9/46; H03J 1/00; H03J 1/0008; H03J 1/0025; H03J 3/20; H03J 3/22; H03J 3/26; H03J 5/02; H03J 5/04; H03J 5/12

USPC ............ 333/235, 204, 205, 207, 209, 219.1, 333/224, 232, 202, 203

See application file for complete search history.

(56) References Cited

U.S. PATENT DOCUMENTS 4,639,699 A * 1/1987 Nishikawa ................ H01P 7/10
  333/202
4,644,303 A * 2/1987 Jachowski ............ H01P 1/2138
  333/134

(Continued)

FOREIGN PATENT DOCUMENTS

| CN | 102324602 A | 1/2012 |
|---|---|---|
| EP | 1372211 A2 | 12/2003 |

(Continued)

OTHER PUBLICATIONS

English language abstract for CN102324602 extracted from espacenet.com database, Aug. 7, 2013, 1 page.

(Continued)

*Primary Examiner* — Barbara Summons
(74) *Attorney, Agent, or Firm* — Howard & Howard Attorneys PLLC

(57) ABSTRACT

A tuneable filter comprising at least one resonator body comprising a resonant cavity defined by an electrically conducting cavity wall, the cavity wall comprising a grounding face, a capacitive face and a surrounding wall extending therebetween; a resonator within the cavity; and, a detuning arm arranged within the cavity substantially parallel to the capacitive face, the detuning arm being adapted to rotate in a plane substantially parallel to the capacitive face about a detuning axis.

21 Claims, 8 Drawing Sheets

(56) References Cited

U.S. PATENT DOCUMENTS

| | | | | |
|---|---|---|---|---|
| 5,070,313 | A | * | 12/1991 | Gladh .................. H03J 3/20 333/202 |
| 5,285,178 | A | * | 2/1994 | Ahlberg ................ H01P 7/04 333/224 |
| 5,777,534 | A | | 7/1998 | Harrison |
| 7,180,391 | B2 | * | 2/2007 | Ala-Kojola .......... H01P 1/2053 333/134 |
| 2003/0025569 | A1 | * | 2/2003 | Tiihonen ..................... 333/17.1 |
| 2006/0255888 | A1 | * | 11/2006 | Mayr .................... H01P 7/04 333/223 |
| 2009/0280991 | A1 | | 11/2009 | Yamanaka et al. |
| 2010/0171573 | A1 | * | 7/2010 | Widgery ..................... 333/219.1 |

FOREIGN PATENT DOCUMENTS

| | | | |
|---|---|---|---|
| JP | 61-136302 A | * | 6/1986 |
| WO | WO 2006/019302 A1 | * | 2/2006 |
| WO | 2009056813 A1 | | 5/2009 |
| WO | WO 2009-056813 A1 | * | 5/2009 |
| WO | 2011053529 A1 | | 5/2011 |

OTHER PUBLICATIONS

European Search Report, GB Application No. 1303850.0, Jul. 8, 2013, 2 pages.

* cited by examiner

TUNEABLE FILTER

The subject patent application claims priority to and all the benefits of United Kingdom Patent Application No. GB1203833.7, which was filed on Mar. 5, 2012 with The UK Patent Office, the disclosure of which is hereby incorporated by reference.

The present invention relates to a tuneable filter. More particularly, but not exclusively, the present invention relates to a tuneable filter comprising a resonator body, the resonator body comprising a resonant cavity having an electrically conducting resonator and a detuning arm therein, the detuning arm being arranged to rotate in a plane substantially parallel to the capacitive face of the resonant cavity.

Some regions of the frequency spectrum are reserved for special use, for example regions reserved for use by the police or other emergency services. Operators of mobile telecommunication systems typically include bandstop filters in basestations to prevent signals being unintentionally transmitted in these bands.

From time to time the government may re-allocate parts of the frequency spectrum freeing up reserved parts for public use. In order to take advantage of these released parts the bandstop filters in the base stations need to be removed. There are a large number of base stations worldwide. Sending engineers to each base station to remove or otherwise disable the bandstop filters would be prohibitively expensive and time consuming.

One solution to this problem is to include a switch in the signal path in the basestation. When the switch is in a first position the microwave signal passes through the bandstop filter to the antenna. When the switch is in a second position the signal bypasses the bandstop filter.

Such switches can be controlled remotely so eliminating the need for an engineer to visit the base station. However, the switch introduces noise into the signal. Further, tuning mechanisms and switches with contacting metal parts may cause intermodulation distortion in high power RF cavities interfering with the reception of other signals. Contacting metal parts may also seize due to cold welding and corrosion, particularly when they are not operated often. Contacting parts may not have lubricants within the RF cavity. The tuning may be infrequent or even only once.

The present invention seeks to overcome the problems of the prior art. Accordingly, in a first aspect, the present invention provides a tuneable filter comprising
at least one resonator body comprising
a resonant cavity defined by an electrically conducting cavity wall, the cavity wall comprising a grounding face, a capacitive face and a surrounding wall extending therebetween;
a resonator within the cavity; and,
a detuning arm arranged within the cavity substantially parallel to the capacitive face, the detuning arm being adapted to rotate in a plane substantially parallel to the capacitive face about a detuning axis.

The tuneable filter according to the invention can function as a bandstop or bandpass filter or as a highpass or lowpass filter over different frequency ranges depending on the position of the tuning arm with respect to the resonator. By rotating the tuning arm one can simply and reliably change the frequency range blocked by the filter.

Preferably the moment of inertia of the portion of the detuning arm on one side of the detuning axis about the detuning axis is substantially similar to the moment of inertia of the portion of the detuning arm on the opposite side of the detuning axis about the detuning axis.

The resonator can be an electrically conducting resonator.
The resonator can be a dielectric resonator.
Preferably, the resonator extends from the grounding face part way to the capacitive face.
Preferably the detuning arm is arranged closer to the capacitive face than the resonator is.
The detuning arm can be arranged such that during at least part of its rotation about the detuning axis at least a portion of the detuning arm is arranged in the gap between the resonator and capacitive face.
The tuneable filter can further comprise a tuning screw at least partially arranged within the cavity.
The detuning arm can be a disk.
The detuning arm can be an elongate rod or plate.
Preferably the elongate rod or plate comprises an enlarged portion at each end and a support portion extending therebetween.
The support portion can be a metal or a dielectric or a combination of the two.
The enlarged portions can be dielectric materials.
The enlarged portions can be metals. The enlarged portions may be of different types of metals.
One enlarged portion can be a dielectric and the other can be a metal.
The tuneable filter can further comprise a motor, preferably a stepper motor, arranged outside the cavity and connected to the detuning arm for rotating the detuning arm around the detuning axis.
The detuning arm can be adapted to be rotated between a first 'on' position and a second 'off' position.
The tuneable filter can comprise a plurality of resonator bodies.
The filter can be a bandstop filter.
The filter can be a bandpass filter.
The filter can be either a highpass or lowpass filter.
In a further aspect of the invention there is provided a method of operation of a tuneable filter comprising the steps of
(i) providing a filter as claimed in any one of claims 1 to 22; and,
(ii) rotating the detuning arm until the resonant frequency of the filter is a maximum or a minimum.

The present invention will now be described by way of example only and not in any limitative sense with reference to the accompanying drawings in which FIG. 1 shows a resonator body of a tuneable filter according to the invention in vertical cross section;

Figure 1:
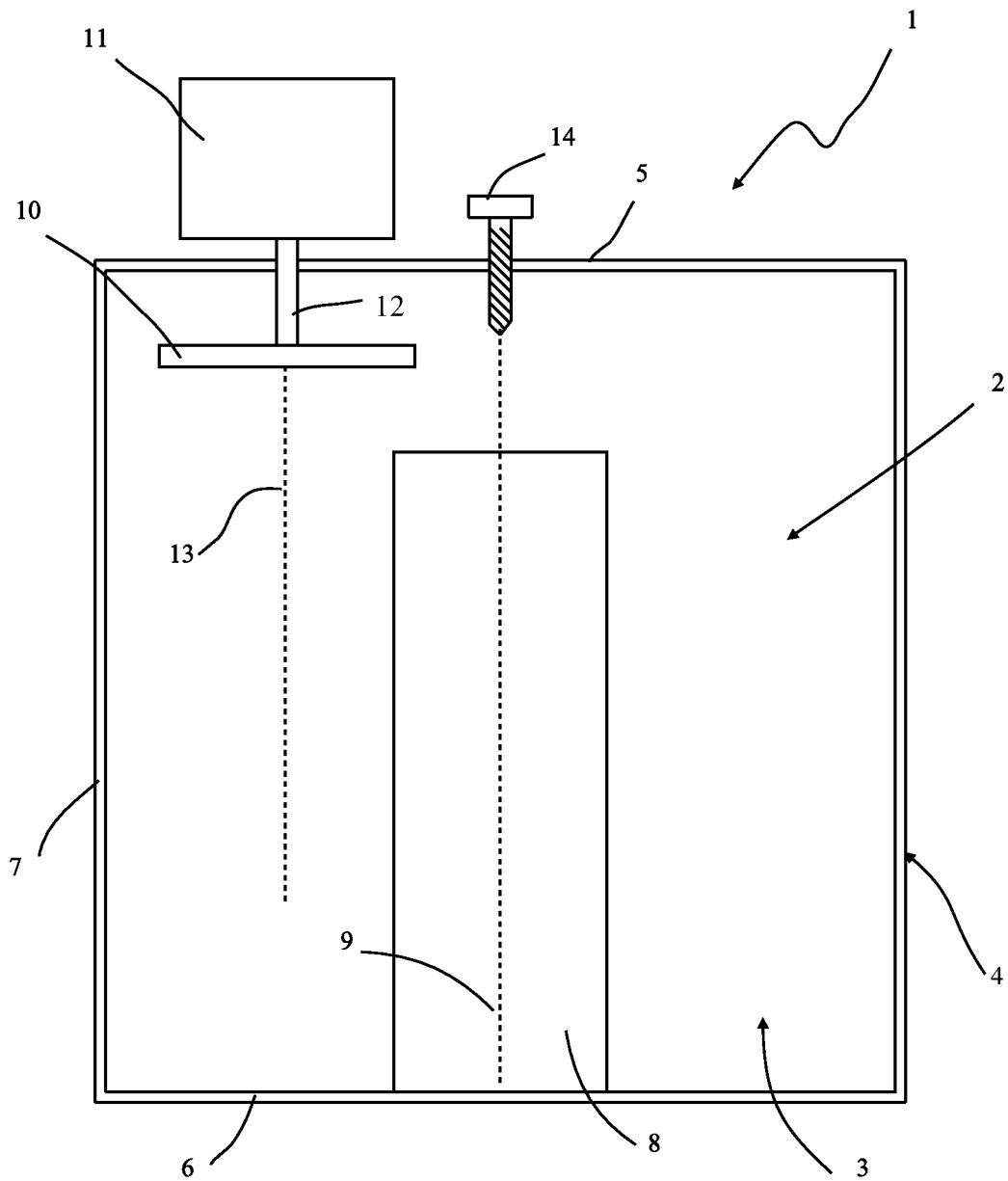

Shown in FIG. 1 is a tuneable filter 1 according to the invention. In this embodiment the tuneable filter 1 is a bandstop filter.

The filter 1 comprises resonator body 2 comprising a resonant cavity 3. The resonant cavity 3 is defined by an electrically conducting cavity wall 4. The cavity wall 4 comprises a capacitive face 5, a grounding face 6 and a side wall 7 extending therebetween.

An electrically conducting resonator 8 is arranged within the cavity 3 and extends from the grounding face 6 part way towards the capacitive face 5 along a resonator axis 9 as shown. The operation of such resonator bodies 2 is known and will not be described in detail.

Arranged within the cavity 3 is a detuning arm 10. The detuning arm 10 is planar and substantially parallel to the capacitive face 5. Outside the resonant cavity 3 is a motor 11, preferably a stepper motor. The stepper motor 11 is connected to the detuning arm 10 by means of a connecting rod 12 which extends through the cavity wall 4. The stepper motor 11 rotates the connecting rod 12 which in turn rotates the detuning arm 10 about a detuning axis 13. The detuning arm 10 can be notionally split into first and second halves on opposite sides of the detuning axis 13. The detuning arm 10 is preferably adapted such that the moment of inertia of the two halves about the detuning axis are equal.

The resonator body 2 further comprises a tuning screw 14 arranged on the resonator axis 9 which extends into the resonant cavity 3. Turning the screw 14 alters the resonant frequency of the cavity 3.

Figure 2:
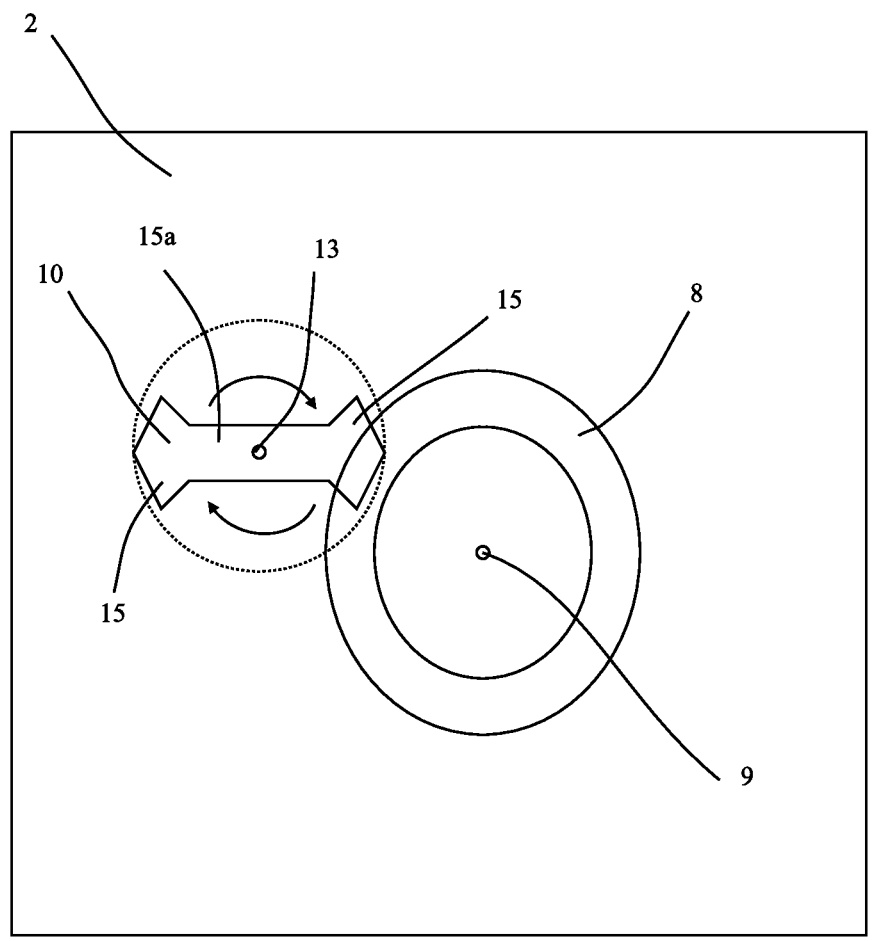
FIG. 2 shows the resonator body of FIG. 1 from above.

FIG. 2 shows the resonator body 2 of the filter 1 of FIG. 1 from above. In this embodiment the detuning arm 10 comprises an elongate plate having enlarged portions 15 at each end and a support arm 15a extending therebetween. The detuning arm 10 is symmetric about the detuning axis 13. One half of the detuning arm 10 is a metal, in particular copper. The other half of the detuning arm 10 is a dielectric material, in this embodiment a plastics material.

The detuning arm 10 is arranged such that during part of its rotation the enlarged portion 15 of the detuning arm 10 passes into the gap between the resonator 8 and capacitive face 5.

Figure 3:
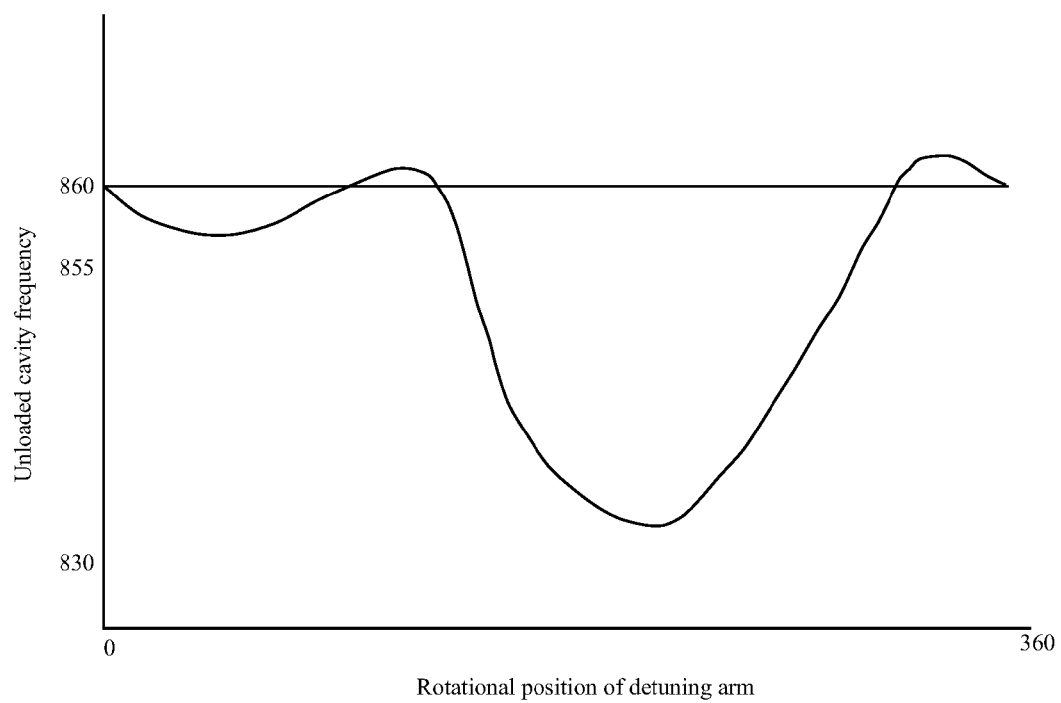
FIG. 3 shows the unloaded resonant cavity frequency of the resonator body of the filter according to the invention as a function of detuning arm position.

The operation of the device is explained with reference to FIG. 3. The position of the tuning screw 14 is held constant so setting a 'base' resonant frequency of the resonator body 2. As the stepper motor 11 turns the detuning arm 10 about the detuning axis 13 the resonant frequency of the resonator body 2 changes about the base frequency as shown. The minimum resonant frequency is when the metal portion of the detuning arm 10 is over the resonator 8. The maximum frequency of this particular embodiment is 114 degrees away. At this point the tuning effects of the metal and plastics parts of the detuning arm 10 balance each other. There is a further turning point in the resonant frequency as a function of position of the detuning arm 180 degrees away when the plastics end of the detuning arm 10 is over the resonator 8. If the detuning arm 10 of the resonator body 2 is held constant and the tuning screw 14 is turned then the base resonant frequency shifts up or down depending on the direction of rotation of the tuning screw 14. Because the detuning axis 13 is offset from the resonator axis 9 the tuning screw 14 can be adjusted independently of the detuning arm 10.

Figure 4:
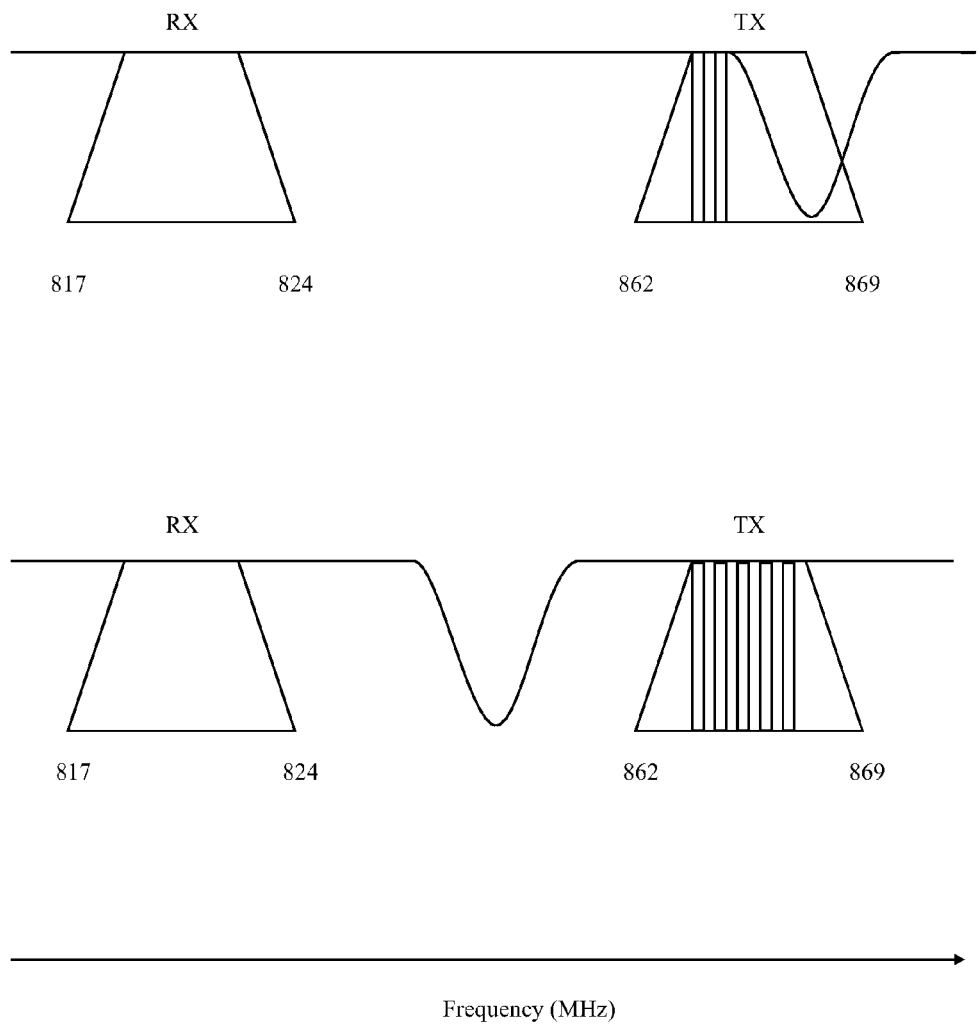
FIG. 4 shows a typical signal spectrum with the transmission characteristic of the filter according to the invention imposed thereon.

Use of the filter 1 according to the invention is explained with reference to FIG. 4. The filter 1 is employed in a microwave base station which transmits microwave signals in the TX band and receives signals in the RX band (shown). The upper edge of the TX band is reserved and is not available for public use. The filter 1 according to the invention is arranged with the detuning arm 10 in a position such that the resonant frequency of the resonator body 2 is a maximum. The tuning screw 14 is then turned until the stop band of the bandstop filter 1 covers the upper edge of the TX band as shown.

If the upper edge of the TX band becomes available for public use then the stepper motor 11 rotates the detuning arm 10 so that the resonant frequency of the resonator body 2 drops. This shifts the stop band of the filter 1 to a position between the TX and RX bands as shown. Preferably the filter 1 is designed such that when the resonant frequency of the resonator body 2 is a minimum the stop band of the filter 1 lies between the TX and RX bands. Accordingly, the upper edge of the TX band can be freed for use in a simple and reliable manner. As the stepper motor 11 can be operated remotely there is no need for the engineer to visit the microwave base station.

The filter 1 according to the invention has a number of advantages. No fine tuning of the position of the detuning arm 10 is required. In order to switch the band stop of the filter 1 from one state to another a large degree of rotation of the detuning arm 10 is required. In addition, because the detuning arm 10 is preferably set at a turning point in the function of resonant frequency as a function of detuning arm position small changes in the position of the detuning arm 10 have negligible effect in the operation of the filter 1. The filter 1 is therefore insensitive to vibration and temperature effects on the detuning arm 10. Further, the detuning arm 10 can be a symmetric shape about the detuning axis 13 again preventing movement under vibration.

A further advantage is that the detuning arm 10 produces little loss in the resonator body 2 in either state as signals passing through the resonator body 2 are typically far from resonance of the resonator body 2.

A further advantage is that it will not seize or cause intermodulation because it does not have contacting metal parts.

Alternative shapes of detuning arm 10 are possible. In an alternative embodiment the detuning arm 10 is a rod.

Alternative compositions of the detuning arm 10 are also possible. The detuning arm 10 could be entirely a dielectric material, preferably a plastics material. Alternatively it could be entirely a metal, preferably copper. Detuning arms 10 of a mixed composition are to be preferred. As a further alternative the two enlarged portions 15 could be metal and the support portion 15a could be a dielectric. The metals may be of different types and densities to each other. If so the end portions are dimensioned to maintain similar moments of inertia of the two halves of the detuning arm.

In a further embodiment of the invention the detuning arm 10 is a disk arranged in a plane substantially parallel to the capacitive face 5. The disk is typically half metal and half dielectric material.

In a further embodiment of the invention the resonator 8 is a dielectric material.

Figure 5:
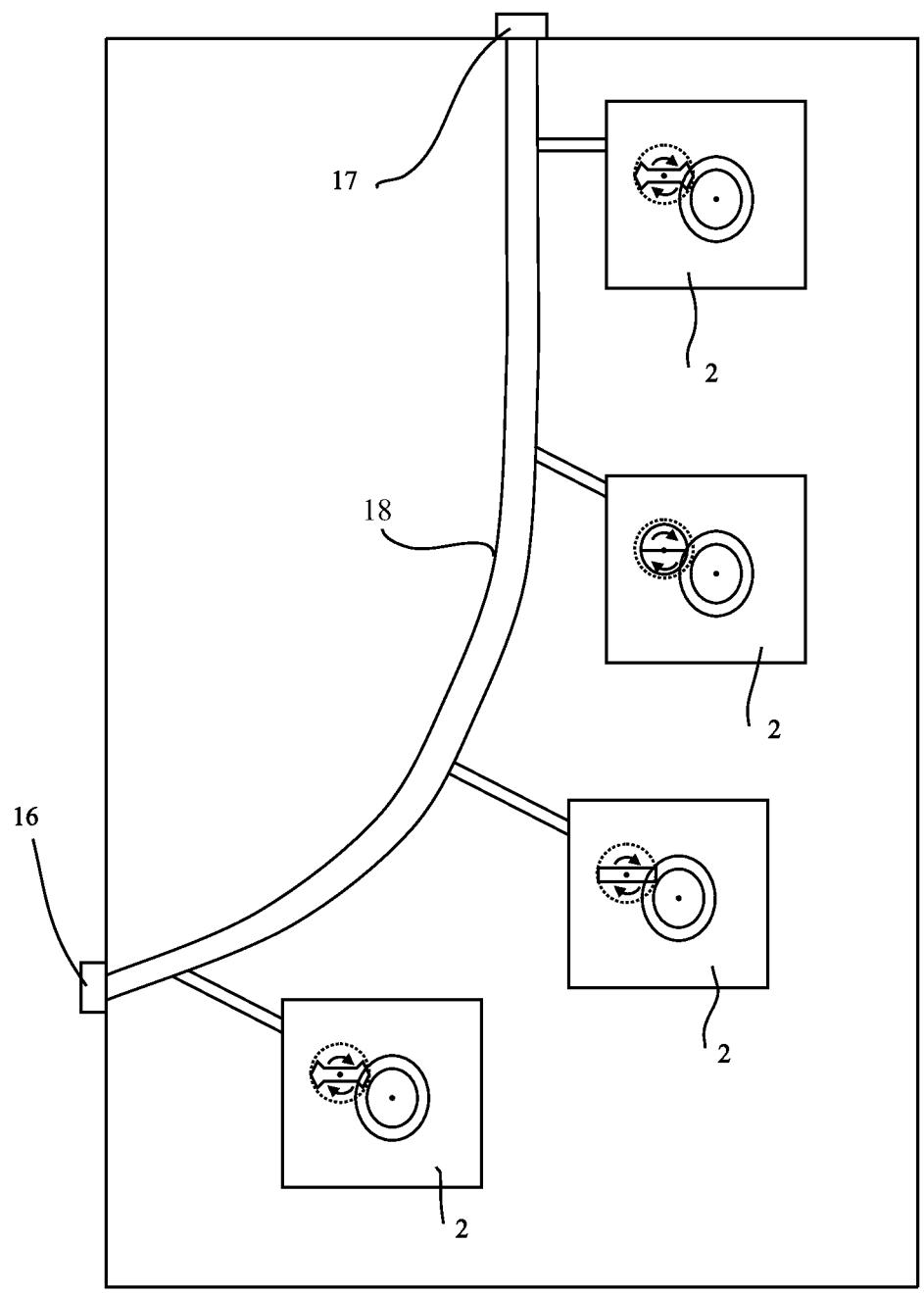
FIG. 5 shows a filter according to the invention comprising a plurality of resonator bodies in top view.

In a further embodiment of the invention the tuneable filter 1 comprises a plurality of resonator bodies 2. An example of such a filter is shown in FIG. 5. The filter 1 comprises input and output ports 16,17 having a signal path 18 therebetween. Extending from the signal path 18 are resonator bodies 2. In this embodiment different resonator bodies 2 have different styles of detuning arms 10. In an alternative embodiment the detuning arm 10 is the same for each resonator body 2.

Figure 6:
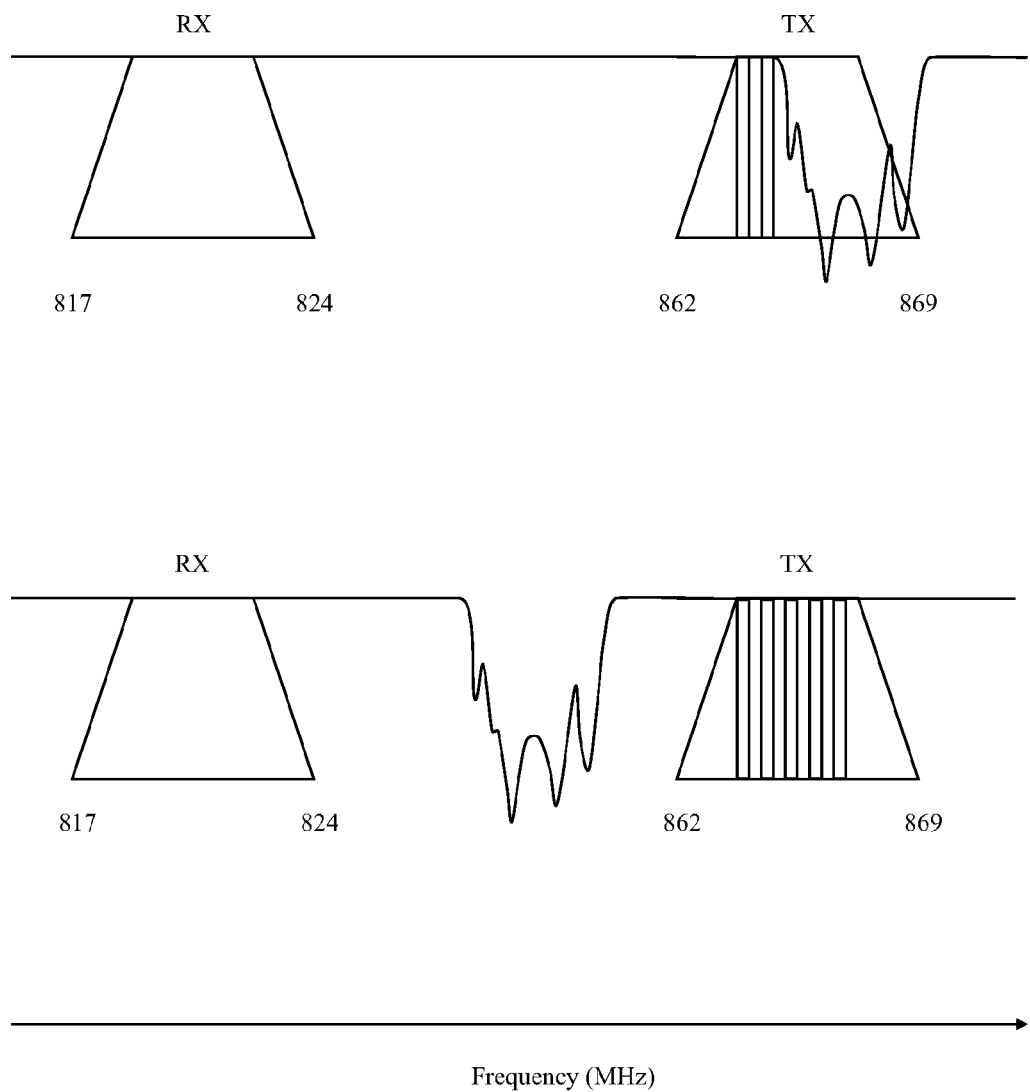
FIG. 6 shows the transmission characteristic of the filter of FIG. 5.

The operation of a filter 1 according to the invention including a plurality of resonator bodies 2 is shown in FIG. 6. Each resonator body 2 has a slightly different bandstop region centred about a slightly different frequency to the others. This results in a filter 1 with a wider total bandstop range then one employing one resonator body 2 only. When one wishes to move the bandstop range of the filter 1 then one turns the detuning arms 10 in each of the resonator bodies 2. The detuning arms 10 could be turned independently of each other if one desires finer control over the bandstop range of the filter 1.

Figure 7:
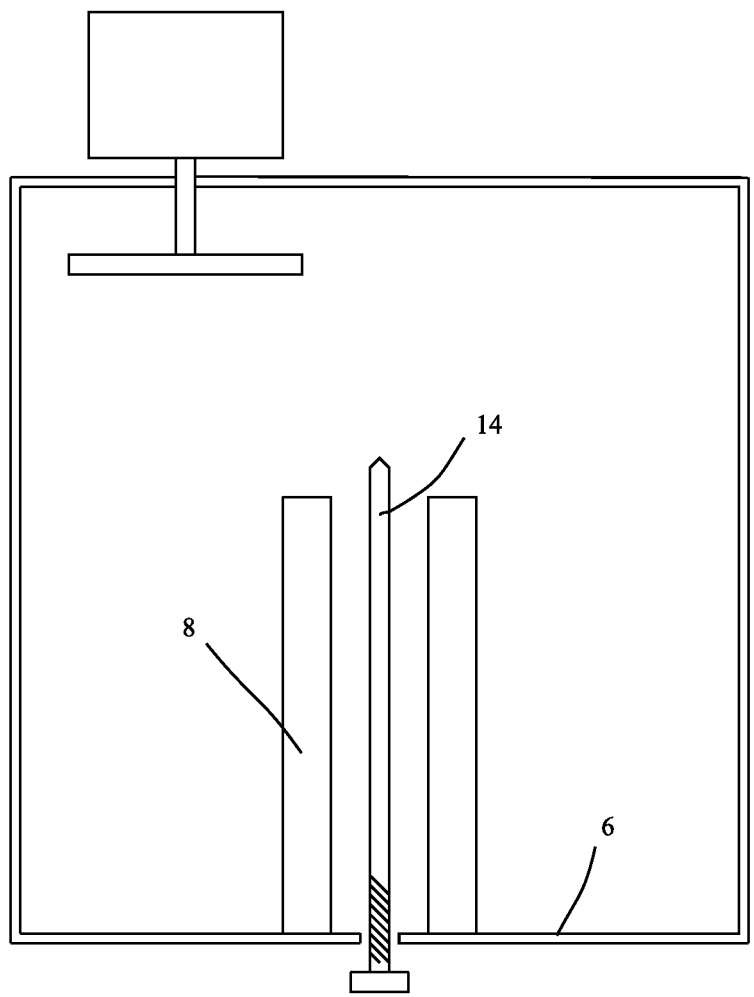
FIG. 7 shows a further embodiment of a tuneable filter according to the invention; and, FIG. 8 shows a further embodiment of a tuneable filter according to the invention.

In the above embodiment the tuning screw 14 is a simple screw extending through the capacitive face 5. FIG. 7 shows an alternative embodiment in which the resonator 8 is a hollow tube with the tuning screw 14 extending through the grounding face 6 and along the length of the resonator 8.

Figure 8:
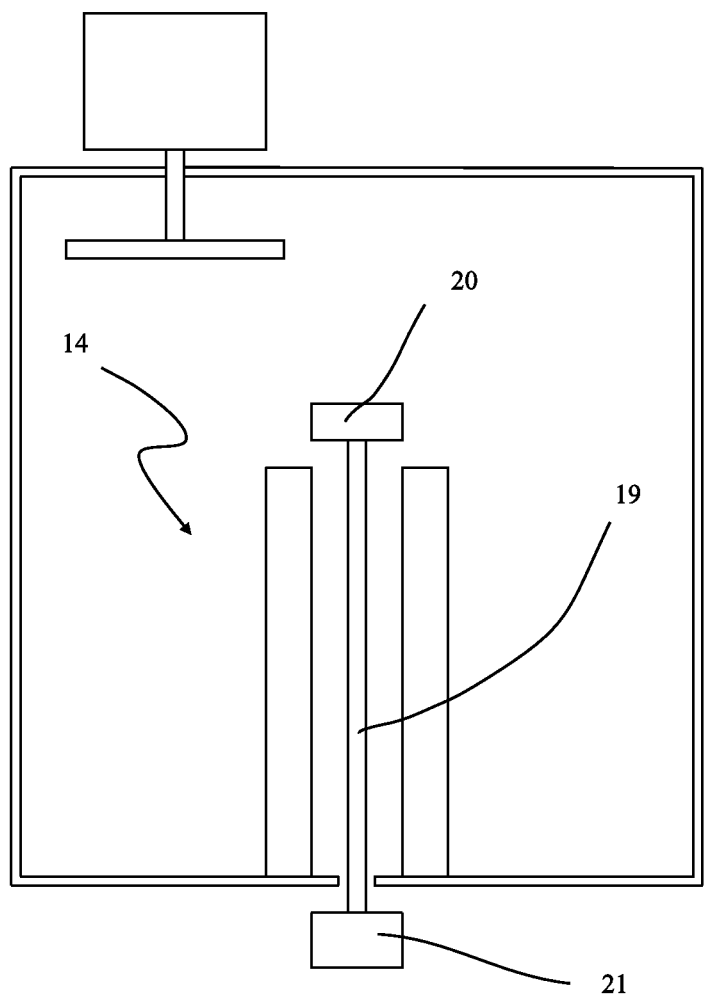

The term tuning screw 14 is used in a generic sense to cover mechanisms which can be displaced within the cavity 3 to alter the resonant frequency of the cavity 3. FIG. 8 shows a further embodiment in which the tuning screw 14 comprises a rod 19 having a dielectric tuning member 20 on its end. In this embodiment the rod 19 is controlled by an electromechanical displacement means 21 which preferably includes a feedback mechanism to correct for vibrational and/or temperature effects. In an alternative embodiment it is manually controlled.

In a further embodiment (not shown) the resonator body 2 lacks the tuning screw 14. The resonator body 2 is designed to resonate at the correct frequency without the use of a screw 14.

All of the embodiments described above are bandstop filters. In alternative embodiments the filter 1 can be a bandpass filter. In further alternative embodiments the filter can be a highpass filter or a lowpass filter.

In a further embodiment of the invention the detuning arm 10 is adapted to be rotated between a plurality (typically two) preset positions. In use the operator provides a signal to the stepper motor 11 which rotates the detuning arm 10 between the predetermined positions. This simplifies operation of the filter 1 as it needs only to be sent an 'on' or 'off' signal to move the detuning arm 10 to the desired position.

The filter 1 according to the invention has other applications. The filter 1 could for example be used to track a signal that can be moved by an operator to limit spurious emissions or to protect the receiver from interference.

The invention claimed is:

1. A tuneable filter comprising:
   at least one resonator body comprising a resonant cavity defined by an electrically conducting cavity wall, the cavity wall comprising a grounding face, a capacitive face and a surrounding wall extending therebetween;
   a resonator within the cavity; and,
   a detuning arm arranged within the cavity substantially parallel to the capacitive face, the detuning arm being adapted to rotate in a plane substantially parallel to the capacitive face about a detuning axis;
   wherein a moment of inertia of a first portion of the detuning arm on one side of the detuning axis about the detuning axis is substantially similar to a moment of inertia of a second portion of the detuning arm on an opposite side of the detuning axis about the detuning axis.

2. A tuneable filter as claimed in claim 1, wherein the resonator is an electrically conducting resonator.

3. A tuneable filter as claimed in claim 1, wherein the resonator is a dielectric resonator.

4. A tuneable filter as claimed in claim 1, wherein the resonator extends from the grounding face part way to the capacitive face.

5. A tuneable filter as claimed claim 1, further comprising a tuning screw at least partially arranged within the cavity.

6. A tuneable filter as claimed in claim 1, wherein the detuning arm is a disk.

7. A tuneable filter as claimed in claim 1, wherein the detuning arm is an elongate rod or plate.

8. A tuneable filter as claimed in claim 7, wherein the detuning arm comprises an enlarged portion at each end and a support portion extending therebetween.

9. A tuneable filter as claimed in claim 8, wherein the support portion is one of a metal, a dielectric, and a combination of a metal and a dielectric.

10. A tuneable filter as claimed in claim 8, wherein the enlarged portions are dielectric materials.

11. A tuneable filter as claimed in claim 8, wherein the enlarged portions are metals.

12. A tuneable filter as claimed in claim 11, wherein the two enlarged portions are of different types of metal.

13. A tuneable filter as claimed in claim 8, wherein one enlarged portion is a metal and the other enlarged portion is a dielectric.

14. A tuneable filter as claimed in claim 1, further comprising a motor arranged outside the cavity and connected to the detuning arm for rotating the detuning arm around the detuning axis.

15. A tuneable filter as claimed in claim 1, wherein the detuning arm is adapted to be rotated between a first 'on' position and a second 'off' position.

16. A tuneable filter as claimed in claim 1, comprising a plurality of resonator bodies.

17. A tuneable filter as claimed in claim 1, wherein the filter is a bandpass filter.

18. A tuneable filter as claimed in claim 1, wherein the filter is a highpass or a lowpass filter.

19. A tuneable filter comprising:
    at least one resonator body comprising a resonant cavity defined by an electrically conducting cavity wall, the cavity wall comprising a grounding face, a capacitive face and a surrounding wall extending therebetween;
    a resonator within the cavity; and,
    a detuning arm arranged within the cavity substantially parallel to the capacitive face, the detuning arm being adapted to rotate in a plane substantially parallel to the capacitive face about a detuning axis;
    wherein a moment of inertia of a first portion of the detuning arm on one side of the detuning axis about the detuning axis is substantially similar to a moment of inertia of a second portion of the detuning arm on an opposite side of the detuning axis about the detuning axis; and
    wherein the detuning arm is arranged closer to the capacitive face than the resonator is.

20. A tuneable filter as claimed in claim 19, wherein the detuning arm is arranged such that during at least part of a rotation of the detuning arm about the detuning axis at least a portion of the detuning arm is arranged in a gap defined between the resonator and capacitive face.

21. A tuneable filter comprising:
    at least one resonator body comprising a resonant cavity defined by an electrically conducting cavity wall, the cavity wall comprising a grounding face, a capacitive face and a surrounding wall extending therebetween;
    a resonator within the cavity; and,
    a detuning arm arranged within the cavity substantially parallel to the capacitive face, the detuning arm being adapted to rotate in a plane substantially parallel to the capacitive face about a detuning axis;
    wherein a moment of inertia of a first portion of the detuning arm on one side of the detuning axis about the detuning axis is substantially similar to a moment of inertia of a second portion of the detuning arm on an opposite side of the detuning axis about the detuning axis; and wherein the filter is any one of a bandstop filter, bandpass filter, a highpass filter or a lowpass filter.

* * * * *